(12) United States Patent
Prasad et al.

(10) Patent No.: US 7,032,192 B2
(45) Date of Patent: Apr. 18, 2006

(54) PERFORMING LATCH MAPPING OF SEQUENTIAL CIRCUITS

(75) Inventors: Mukul R. Prasad, Sunnyvale, CA (US); Rajarshi Mukherjee, San Jose, CA (US); Jawahar Jain, Santa Clara, CA (US); Kelvin K. C. Ng, Vancouver (CA)

(73) Assignee: Fujitsu Limited, Kawasaki (JP)

( * ) Notice: Subject to any disclaimer, the term of this patent is extended or adjusted under 35 U.S.C. 154(b) by 261 days.

(21) Appl. No.: 10/444,232

(22) Filed: May 22, 2003

(65) Prior Publication Data

US 2004/0237057 A1 Nov. 25, 2004

(51) Int. Cl.
G06F 17/50 (2006.01)

(52) U.S. Cl. ............................... 716/3; 716/4
(58) Field of Classification Search ............... 716/1–5
See application file for complete search history.

(56) References Cited

U.S. PATENT DOCUMENTS

| | | | | |
|---|---|---|---|---|
| 6,247,163 | B1 * | 6/2001 | Burch et al. ............... | 716/3 |
| 6,408,424 | B1 * | 6/2002 | Mukherjee et al. ......... | 716/5 |
| 6,496,955 | B1 * | 12/2002 | Chandra et al. ............ | 716/3 |
| 6,611,947 | B1 * | 8/2003 | Higgins et al. ............. | 716/5 |
| 2003/0163297 | A1 * | 8/2003 | Khaira et al. .............. | 703/15 |

OTHER PUBLICATIONS

C. L. Berman et al., "Functional Comparison of Logic Designs for VLSI Circuits," 1989 IEEE Int'l Conference on Computer-Aided Design, pp. 456-459.*
Prasad, et al., "An Efficient and Scalable Methodology for Latch Correspondence Using Hybrid Methods & Incremental Reasoning Implemented on a General Purpose Combinational Equivalence Checker," Mar. 31, 2002 (9 pages).
Anastasakis, et al., "A Practical and Efficient Method for Compare-Point Matching," DAC 2002, Jun. 10-14, 2002, New Orleans, LA, USA, © 2002 ACM 1-58113-461-4/02/ 0006 (6 pages).

(Continued)

Primary Examiner—Leigh M. Garbowski
(74) Attorney, Agent, or Firm—Baker Botts L.L.P.

(57) ABSTRACT

Performing latch mapping includes receiving an initial circuit model representing a first circuit and a second circuit and generating an initial latch mapping for the initial circuit model. The following is repeated until a next latch mapping is at least similar to a current latch mapping to yield a final latch mapping. A current circuit model is constructed according to a previous circuit model. Current potentially equivalent node sets associated with the current circuit model are established in accordance with previous potentially equivalent node sets, where each potentially equivalent node set includes potentially equivalent nodes. Equivalence of the current potentially equivalent node sets is validated, and a current latch mapping is verified in accordance with the validated current potentially equivalent node sets to generate a next latch mapping. The final latch mapping is reported.

34 Claims, 2 Drawing Sheets

OTHER PUBLICATIONS

Daniel Brand, "*Verification of Large Synthesized Designs*," IBM Research Division, Thomas J. Watson Research Center, Yorktown Heights, NY, USA, 1063-6757/93 © 1993 *IEEE*, pp. 534-537.

Burch, et al., "*Robust Latch Mapping for Combinational Equivalence Checking*," (7 pages), IEEE/ACM International conference on CAD, 1998.

Huang, et al., "*AQUILA: An Equivalence Checking System for Large Sequential Designs*" IEEECS Log No. 111799, 0018-9340/00 © 2000 *IEEE* (pp. 443-464).

Kuehlmann, et al., "*Equivalence Checking Using Cuts and Heaps*" DAC 97, Anaheim, CA, © 1997 *ACM* 0-89791-920-3/97/06, (6 pages).

Kunz, et al., "*A Novel Framework for Logic Verification in a Synthesis Environment*," 0278-0070/96 © 1996 IEEE Transactions on Computer-Aided Design of Integrated Circuits and Systems, vol. 15, No. 1, Jan., 1996. (pp. 20-32).

Mukherjee, et al., "*An Efficient Filter-Based Approach for Combinational Verification*," 0278-0070/99 © 1999 IEEE Transactions on Computer-Aided Design of Integrated Circuits and Systems, vol. 18, No. 11, Nov. 1999 (pp. 1542-1557).

Burch, et al., "*Tight Integration of Combinational Verification Methods*," Cadence Berkeley Labs, Berkeley, California (7 pages), unknown.

Stoffel, et al., "*Record & Play: A Structural Fixed Point Iteration for Sequential Circuit Verification*," 0-89791-993-9/97 © 1997 IEEE Transactions on Computer-Aided Design of Integrated Circuits and Systems, (6 pages).

van Eijk, "*Sequential Equivalence Checking Based on Structural Similarities*," 0278-0070/00 © 2000 IEEE Transactions on Computer-Aided Design of Integrated Circuits and Systems, vol. 19, No. 7, Jul. 2000 (pp. 814-819).

van Eijk, et al., "Detection of Equivalent State Variables in Finite State Machine Verification," Eindhoven University of Technology, Department of Electrical Engineering, Design Automation Section, The Netherlands (10 pages), IWLS 1995.

\* cited by examiner

US 7,032,192 B2

PERFORMING LATCH MAPPING OF SEQUENTIAL CIRCUITS

TECHNICAL FIELD OF THE INVENTION

This invention relates generally to the field of circuit design and verification and more specifically to performing latch mapping of sequential circuits.

BACKGROUND OF THE INVENTION

Latch mapping is used in combinational equivalence checking (CEC) to check the functional equivalence of sequential circuits. Typically, latch mapping between circuits is performed, and then the combinational equivalence of the circuits is verified under the latch mapping. Known techniques of performing latch mapping, however, may be inefficient or inaccurate. Consequently, known techniques for performing latch mapping may be unsatisfactory in certain situations.

SUMMARY OF THE INVENTION

In accordance with the present invention, disadvantages and problems associated with previous techniques for latch mapping may be reduced or eliminated.

According to one embodiment of the present invention, performing latch mapping includes receiving an initial circuit model representing a first circuit and a second circuit and generating an initial latch mapping for the initial circuit model. The following is repeated until a next latch mapping is at least similar to a current latch mapping to yield a final latch mapping. A current circuit model is constructed according to a previous circuit model. Current potentially equivalent node sets associated with the current circuit model are established in accordance with previous potentially equivalent node sets, where each potentially equivalent node set includes potentially equivalent nodes. Equivalence of the current potentially equivalent node sets is validated, and a current latch mapping is verified in accordance with the validated current potentially equivalent node sets to generate a next latch mapping. The final latch mapping is reported. According to another embodiment, incremental information is maintained and updated at each step of determining latch mappings, which may improve efficiency.

Certain embodiments of the invention may provide one or more technical advantages. A technical advantage of one embodiment may be that incomplete latch mapping techniques are combined with complete latch mapping techniques, which may allow for the efficiency of incomplete methods and the completeness of complete methods. Another technical advantage may involve improved performance due to the use of incremental information.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
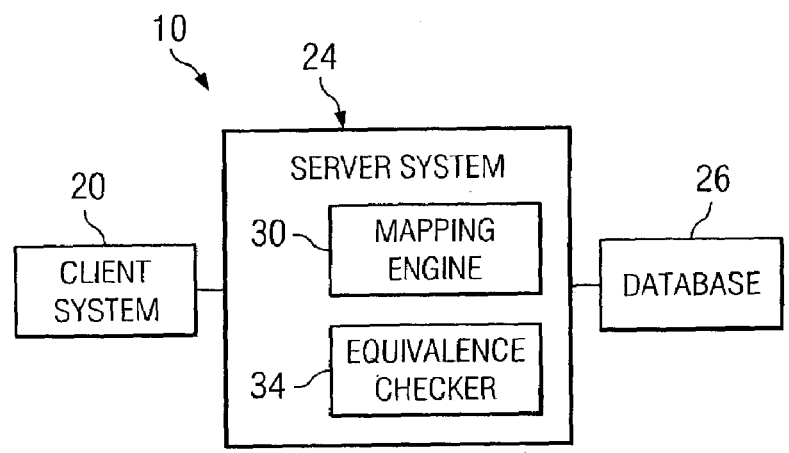
FIG. 1 is a block diagram of one embodiment of a system for performing latch mapping.
Figure 2:
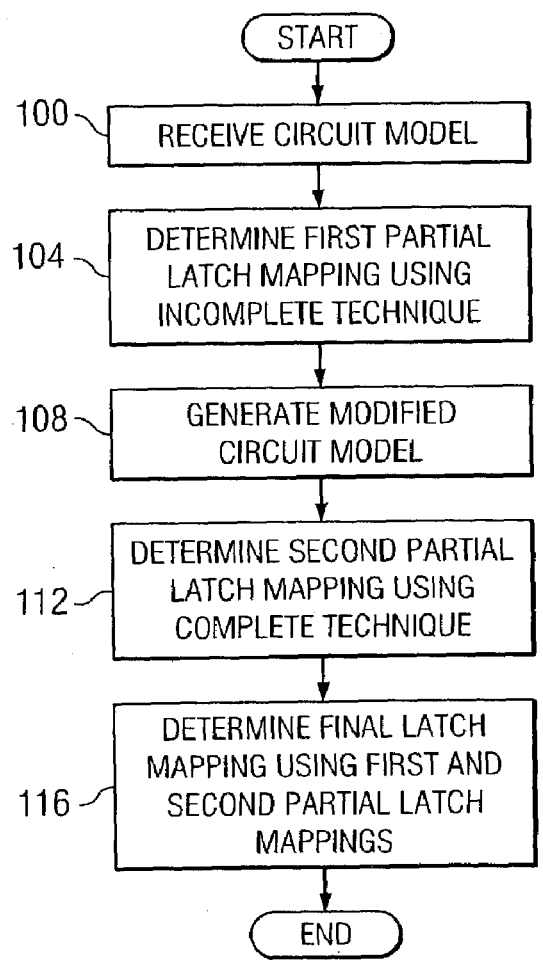
FIG. 2 is a flowchart illustrating one embodiment of a method for performing latch mapping using complete and incomplete latch mapping techniques.
Figure 3:
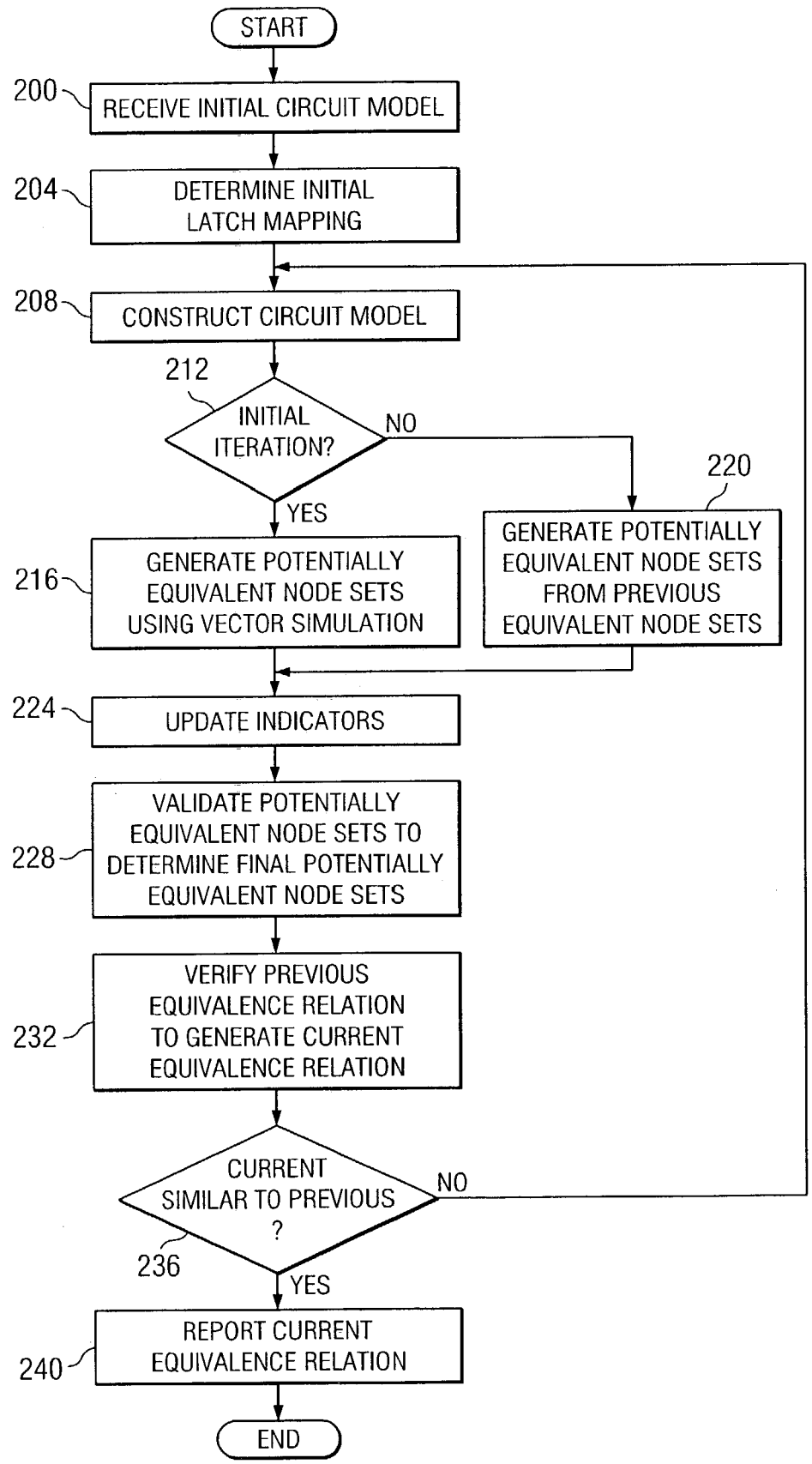
FIG. 3 is a flowchart illustrating one embodiment of a method for performing latch mapping using potentially equivalent nodes.

Embodiments of the present invention and its advantages are best understood by referring to FIGS. 1 through 3 of the drawings, like numerals being used for like and corresponding parts of the various drawings.

FIG. 1 is a block diagram of one embodiment of a system 10 for performing latch mapping. According to the embodiment, system 10 integrates complete and incomplete techniques for latch mapping. Additionally, system 10 may use a combinational equivalence checker to verify approximations of latch equivalence classes. Latch representatives of latch equivalence classes may also be utilized to generate new latch equivalence classes.

System 10 may be used to integrate incomplete latch mapping techniques with complete latch mapping techniques. Incomplete techniques typically use heuristics to efficiently group promising matches. Function based incomplete techniques may use random simulation or automatic test pattern generation search approaches to generate equivalence information that may be used to group latches. Non-function based incomplete techniques may use latch identifiers or latch structure to group latches.

Complete techniques may be implemented as a fixed-point iteration, where each iteration involves solving an equivalence checking problem on a modified combinational circuit model derived from the original circuit model. Binary decision diagrams, automatic test pattern generation engines, or general purpose combinational equivalence checking techniques may be used to perform equivalence checking. Complete methods may be guaranteed to produce a latch mapping if one exists.

Incomplete techniques are typically efficient, but not comprehensive, while complete techniques are typically comprehensive, but not efficient. On the one hand, incomplete methods may efficiently deduce a large percentage of the latch mappings. The incomplete methods, however, cannot guarantee a correct or complete mapping. Complete methods, on the other hand, can guarantee a correct and complete mapping, but may be inefficient for large circuits. System 10 combines incomplete latch mapping techniques with complete latch mapping techniques by extending an incomplete latch mapping to a provably complete and correct latch mapping, which may allow for the efficiency of incomplete methods and the completeness of complete methods.

According to the illustrated embodiment, system 10 includes a client system 20, a server system 24, and a database 26 coupled as shown in FIG. 1. According to one embodiment, client system 20 allows a user to communicate with server system 24 to perform latch mappings. Database 26 stores information used by server system 24.

Server system 24 manages applications that perform latch mapping, such as a latch mapping engine 30 and an equivalence checker 34. Latch mapping engine 30 performs latch mapping using incomplete latch mapping techniques and complete latch mapping techniques. According to one embodiment, latch mapping engine 30 may determine a maximum latch equivalence relation using an iterative process. At each iteration, equivalence relation approximations may be verified according to incremental reasoning that takes advantage of information from previous iterations. Additionally, latch mapping engine 30 may use representative nodes to avoid errors that may be introduced by the incomplete techniques and to identify unlikely equivalencies.

According to one embodiment, latch mapping engine 30 may represent sequential circuits as finite state machines (FSMs). A finite state machine M may comprise, for example, a 6-tuple M=(I, O, L, $S_0$, $\Delta$, $\lambda$), where I=($\chi_1$ $\chi_2$, ..., $\chi_m$) comprises an ordered set of inputs, O=($z_1$ $z_2$, ..., $z_p$) comprises an ordered set of outputs, L comprises an ordered set of state variables denoting latches, $S_0 \subset B^{|L|}$ comprises a non-empty set of initial states, $\Delta: B^{|L|} \times B^m \to B^{|L|}$ comprises the next-state function, and $\lambda: B^{|L|} \times B^m \to B^p$ comprises the output function. A state S of M may comprise a Boolean valuation to the state variables L. The present state and the next state variables corresponding to a latch l may be denoted l and $\delta_l$, respectively.

According to one embodiment, sequential circuits that are checked for equivalence may be represented by $M_{spec}$ indicating a specification FSM and $M_{Impl}$ indicating an implementation FSM. For illustrative purposes, the circuits $M_{spec}$ and $M_{Impl}$ may be assumed to have a single clock, the same inputs and outputs, and the initial states $S_{0,Spec}$ and $S_{0,Impl}$, respectively. These assumptions, however, a made for illustrative purposes only. As an example, system 10 may be used for circuits having multiple initial states. Accordingly, circuit $M_{spec}$=(I, O, $L_{Spec}$, $S_{0,Spec}$L, $\Delta_{Spec}$, $\lambda_{Spec}$), and circuit $M_{Impl}$=(I, O, $L_{Impl}$, $S_{0,Impl}$L, $\Delta_{Impl}$, $\lambda_{Impl}$).

The combined state variables of circuits $M_{spec}$ and $M_{Impl}$ may be denoted by latch variables L=$L_{Spec} \cup L_{Impl}$. If states $S_{Spec}$ and $S_{Impl}$ are states of the states-spaces of circuits $M_{spec}$ and $M_{Impl}$, respectively, that is, $S_{Spec} \in B^{|L_{Spec}|}$ and $S_{Impl} \in B^{|L_{Impl}|}$, the combined state may be denoted by S=$S_{Spec} \cup S_{Impl}$. Similarly, the combined transition function $\Delta$ may be obtained by combining functions $\Delta_{Spec}$ and $\Delta_{Impl}$ and the combined initial state $S_0$=$S_{0,Spec} \cup S_{0,Impl}$.

The latch mapping problem may be posed on the combined set of latch variables L=$L_{Spec} \cup L_{Impl}$ and on the combined states of the state-space of these variables. To simplify description, the prefix "combined" may be dropped when referring to the latch variables and states, stating otherwise if required.

A latch mapping may be represented by a latch equivalence relation $R_L$:L×L→B that comprises an equivalence relation imposed on latches L. Furthermore, the variable correspondence condition $F_L$:$B^{|L|}$→B may comprise a predicate that defines whether a state S conforms to $R_L$, that is, whether equivalent latch variables assume identical values in S:

$F_L(S) \Leftrightarrow \forall l_1, l_2(R_L(l_1,l_2) \Rightarrow S(l_1)=S(l_2))$ Accordingly, latch mapping $R_L$ may be used to group latches that are equivalent into latch equivalence sets such as latch equivalence classes under a notion of sequential equivalence.

According to one embodiment, the Van Eijk definition of the latch mapping relation $R_L$ may be used, which may be described by the following relation $R_L$:

LATCH CORRESPONDENCE RELATION $R_L$: A latch correspondence relation comprises an equivalence relation $R_L$:L× L→B that satisfies the following sufficient, but not necessary, conditions:

(1) Initial state $S_0$ of the combined machine satisfies the following: $F_L(S_0)=1$; and (2) Equivalence relation $R_L$ is invariant under the next state function: $\forall S \in B^{|L|}, X \in B^m: R_L(S) \Rightarrow R_L(\Delta(S,X))$.

According to one embodiment, latch mapping engine 30 may verify the equivalence relation according to incremental reasoning that takes advantage of information from previous iterations. According to incremental reasoning, once nodes are determined to be not equivalent, they remain not equivalent. Furthermore, according to reasoning about incremental behavior, certain nodes may be determined to remain equivalent and therefore are not re-verified. According to one embodiment, latch mapping engine 30 may retain a representative node from each latch equivalence class. The representative nodes may be used to avoid errors that may be introduced by the incomplete techniques and to identify unlikely equivalencies.

Equivalence checker 34 may be used to verify latch mappings by exploiting the structural similarity of the sequential circuits, and may implement any suitable technique such as random simulation, binary decision diagram (BDD), automatic test pattern generation, SAT solvers, structural pruning, or other technique, or any combination of the preceding.

According to one embodiment, equivalence checker 34 may generate equivalence classes of potentially equivalent nodes, iteratively validate pairs of potentially equivalent nodes, and merge or split the equivalence classes based on the validation results. As an example, a set of potentially equivalent nodes may be generated from the internal nodes of sequential circuits by random simulation. Equivalence checker 34 may then sweep the circuits from the primary inputs to the primary outputs in order to resolve the potentially equivalent nodes, using incremental reasoning to take advantage of equivalencies proved during previous iterations. Equivalence checker may drop potentially equivalent node sets that are unlikely to produce matches such as potentially equivalent node sets composed entirely of representative latches.

Client system 20 and server system 24 may each operate on one or more computers and may include appropriate input devices, output devices, mass storage media, processors, memory, or other components for receiving, processing, storing, and communicating information according to the operation of system 10. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client system 20 and server system 24 may be integrated or separated according to particular needs. For example, the present invention contemplates the functions of both client system 20 and server system 24 being provided using a single computer system, for example, a single personal computer. If client system 20 and server system 24 are separate, client system 20 may be coupled to server system 24 using one or more local area networks (LANs), metropolitan area networks (MANs), wide area networks (WANs), a global computer network such as the Internet, or any other appropriate wire line, wireless, or other links.

Database 26 stores data that may be used by server system 24. Database 26 may be local to or remote from server system 24, and may be coupled to server system 24 using one or more local area networks (LANs), metropolitan area networks (MANs), wide area networks (WANs), a global computer network such as the Internet, or any other appropriate wire line, wireless, or other links. Database 26 may store, for example, a circuit model, equivalence classes, or potentially equivalent nodes.

Modifications, additions, or omissions may be made to system 10 without departing from the scope of the invention. Moreover, the operations of system 10 may be performed by more or fewer modules. For example, the operations of latch mapping engine 30 and equivalence checker 34 may be performed by one module, or the operations of latch mapping engine 30 may be performed by more than one module. Additionally, functions may be performed using any suitable logic comprising software, hardware, other logic, or any suitable combination of the preceding. As used in this document, "each" refers to each member of a set or each member of a subset of a set.

FIG. 2 is a flowchart illustrating one embodiment of a method for performing latch mapping using complete and incomplete latch mapping techniques. According to the embodiment, if latch mappings $R_1$ and $R_2$ are partial latch mappings produced by incomplete and complete techniques, respectively, the final match can be computed as $\langle R_1 \vee R_2 \rangle$, where $\langle R \rangle$ denotes the transitive closure of relation R.

The method begins at step 100, where circuit model P is received. A first partial latch mapping $R_{L_{sub}}$ comprising an equivalence relation over the set of latches $L_{sub} \subseteq L$ is determined at step 104. Partial latch mapping $R_{L_{sub}}$ may be generated by one or more incomplete methods, and may comprise a true relation where $R_{L_{sub}} \subseteq R_L^{max}$, that is, the equivalences specified in latch mapping $R_{L_{sub}}$ are true in any correct and complete solution to the latch mapping problem.

A modified circuit model P* is generated from circuit model P and latch mapping $R_{L_{sub}}$ at step 108. According to one embodiment, latch mapping $R_{L_{sub}}$ comprises q equivalence classes $C_1, C_2, \ldots, C_q$. The equivalences represented by latch mapping $R_{L_{sub}}$ may be imposed on the present-state variables of circuit model P by merging specified equivalent latches.

For each equivalence class $C_i$, a constituent latch $l_{rep}^i$ may be selected as its representative. The next state functions of the latches of the set $L_{sub} - \bigcup_{i=1}^{q} l_{rep}^i$ as well as cones of logic exclusively feeding them are removed from circuit model P to yield modified circuit model P*. Using latch representatives may provide for more efficient determination of equivalence. As an example, if an equivalence class has only latch representatives, each representative may be split into its own equivalence class.

A second partial latch mapping $R_{rep}^{max}$ is determined at step 112 by applying a complete technique to modified circuit model P*. According to one embodiment, the complete technique may comprise any suitable technique such as the van Eijk latch mapping technique. For example, first an initial approximation of latch mapping $R^0_L$ that groups latches into latch equivalence classes is computed. At successive iterations, latch mapping $R^i_L$ is imposed on the present state variables of the modified circuit model to generate latch constraints. A next latch mapping $R_L^{i+1}$, which may split latch equivalence classes of $R_L^i$ to yield new latch equivalence classes, is determined from the latch values according to any suitable manner. The iterations cease when latch mappings $R_L^{i+1} = R_L^i$, which yields maximum latch correspondence relation $R_L^{max} = R_L^i$.

A final latch mapping $\langle R_{L_{sub}} \vee R_{rep}^{max} \rangle$ is determined at step 116 from first partial latch mapping $R_{L_{sub}}$ and second partial latch mapping $R_{rep}^{max}$. Latch mapping $\langle R_{L_{sub}} \vee R_{rep}^{max} \rangle$ may comprise the maximum latch correspondence $R_L^{max}$ that would be computed by van Eijk's algorithm executed on the original circuit model P according to the following Theorem T-1:

THEOREM T-1: Given a latch mapping problem for a circuit model P and a partial, true latch equivalence relation $R_{L_{sub}}$, if latch mapping $R_{rep}^{max}$ is the latch equivalence relation computed using the above procedure, then latch mapping $\langle R_{L_{sub}} \vee R_{rep}^{max} \rangle = R_L^{max}$.

Accordingly, the method may provide an efficient complete technique for latch mapping by allowing a complete method to use the information of an approximation of latch mapping $R_{L_{sub}}$ from an incomplete method.

Modifications, additions, or omissions may be made to the method without departing from the scope of the invention. For example, the first partial latch mapping may be received from a database instead of being computed. Additionally, steps may be performed in any suitable order without departing from the scope of the invention.

FIG. 3 is a flowchart illustrating one embodiment of a method for performing latch mapping using potentially equivalent nodes. According to the embodiment, potentially equivalent nodes of a circuit model are grouped together, where the nodes of different groups are not combinationally equivalent. Initially, nodes with the same simulation signature are grouped together as a potentially equivalent node set. The sets are refined by successively validating potentially equivalent node pairs from each group, until the potentially equivalent nodes have been resolved by either having been proved equivalent or proved inequivalent.

The method begins at step 200, where initial circuit model P is received. Latch mapping $R_L^0$ is computed at step 204 according to $R_L^0(l_i, l_j) \Leftrightarrow (S_0(l_i) = S_0(l_j))$, and may be refined using a random vector simulation on circuit model P.

Steps 208 to 236 describe iterations of the method, which may use the following notation. At each iteration i, latch inputs L may be constrained by the corresponding latch mapping $R_L^{i-1}$ for circuit model $P^i$. Additionally, if w represents an arbitrary internal node of circuit model P, $w^i$ denotes its instance of circuit model $P^i$. For an internal node w of circuit model P, sets TFI(w) and TFO(w) denote the set of nodes in the transitive fanin and transitive fanout of node w, respectively. As described previously, latch mapping $R_L^i$ may be represented as a set of equivalence classes. For each class $C_j$, a latch $l_{rep}^j$ may be selected as a representative latch, and fanouts of other latches of class $C_j$ are re-routed from representative latch $l_{rep}^j$.

Circuit model $P^i$ is constructed at step 208 by applying conditions of latch mapping $R_L^{i-1}$ on the latch variables. Potentially equivalent node sets populated by internal nodes $W = \{w_1, w_2, \ldots w_n\}$ of the circuit model P may be generated depending on the iteration of the method. If the method is at the initial iteration at step 212, the method proceeds to step 216. Initial potentially equivalent node sets $Q_{init}^1$ may be generated at step 216 through random vector simulation on $P^1$. If the method is not at the initial iteration at step 212, the method proceeds to step 220. Initial potentially equivalent node sets $Q_{init}^i$ may be generated from the previous equivalent node sets $Q_{final}^{i-1}$ according to $Q_{init}^i = Q_{final}^{i-1}$.

Indicators indicating changes to the nodes w of circuit P are updated at step 224. Indicators may include, for example, a single-bit Boolean flag changed(l) that indicates that a node's function has been changed, and a node pointer affected(w) that points to one of the latches in the transitive fanin of 'w' whose function has changed since the last iteration.

As an example, the following procedure may be used to update changed flags and affected pointers for an iteration $i \geq 1$.

```
for all w∈W and l∈L do
    Reset changed flag
    Clear affected pointer
end for
for all l∈L : Rep(l^{i-1}) = 1 do
    if i = 1 then
        affected (l) ← 1
    else if Equiv_Class (δ_l, R_L^{i-1}) ≠ Equiv_Class (δ_l, R_L^{i-2}) then
        affected (l) ← 1
    end if
end for
for all l∈L : (Rep(l^{i-1})=1) ^ (affected(l)≠ NULL) do
    for all w ∈ TFO(l) do
        if affected (w) ≠ NULL then
            changed (w) ← 1
        else
            affected (w) ← 1
        end if
    end for
end for
```

The procedure is presented for illustrative purposes only. Other suitable procedures may be used.

The potentially equivalent node sets are validated at step 228 to determine the next potentially equivalent node sets. According to one embodiment, only information that has potentially changed since the last iteration is validated. Typically, latch mapping $R_L^i$ changes only gradually from iteration i to i+1. Accordingly, it is plausible that a large fraction of the potentially equivalent node equivalencies (and non-equivalencies) that are true at iteration i also hold at iteration i+1. Therefore, the embodiment may extract potentially equivalent node equivalencies (and non-equivalencies) that remain invariant under the refinement of latch mapping $R_L^{i-1}$ to $R_L^i$, performed at iteration i.

According to the embodiment, potentially equivalent node non-equivalencies may be described according to the following Theorem T-2:

THEOREM T-2: Given internal nodes $w_1$ and $w_2$ of circuit model P and some $i \geq 0$, nodes $w_1^i \neq w_2^i \Rightarrow w_1^j \neq w_2^j$ for any $j \geq i$.

Potentially equivalent node equivalencies may be validated according to the following Lemma L-1:

LEMMA L-1: Given internal nodes $w_1, w_2$ of circuit model P, if for some iteration i:

$$w_1^i = w_2^i; \quad (1)$$

$$\forall l_1, l_2 \in (L \cap TFI(w_1)) R_L^{i+1}(l_1,l_2) \Leftrightarrow R_L^i(l_1,l_2); \text{ and} \quad (2)$$

$$\forall l_1, l_2 \in (L \cap TFI(w_2)) R_L^{i+1}(l_1,l_2) \Leftrightarrow R_L^i(l_1,l_2), \quad (3)$$

then $w_1^{i+1} = w_2^{i+1}$.

According to one embodiment, the conditions of the lemma may be approximated to simplify computation. The potentially equivalent node sets may be validated according to the following Theorem T-3:

THEOREM T-3: Given internal nodes $w_1, w_2$ of circuit model P, if for some iteration i, if nodes $w_1^{i-1} = w_2^{i-1}$, and if:

$$\text{affected}(w_1^i) = \text{NULL} \;\hat{}\; \text{changed}(w_2^i) = 0; \text{ or} \quad (1)$$

$$\text{affected}(w_2^i) = \text{NULL} \;\hat{}\; \text{changed}(w_1^i) = 0; \text{ or} \quad (2)$$

$$\text{changed}(w_1^i) = 0 \;\hat{}\; \text{changed}(w_2^i) = 0 \;\hat{} \quad (3)$$

$$(\text{affected}(w_1^i) = \text{affected}(w_2^i) \neq \text{NULL}),$$

then nodes $w_1^i = w_2^i$.

For each internal potentially equivalent node pair $w_1, w_2 \in Q^i$, if nodes $w_1$ and $w_2$ satisfy the conditions of Theorem 3.3, then node equivalence $w_1 = w_2$ is inferred. If otherwise, then the following $w_1 \underline{?} w_2$ is checked. If nodes $w_1 \neq w_2$, circuit model $P^1$ is simulated with the obtained distinguishing vector to refine $Q^i$ and $R_L^{i-1}$. The final iteration yields final potentially equivalent node set $Q_{final}^i$.

Previous latch mapping $R_L^{i-1}$ is verified at step 232 to generate a current latch mapping $R_L^i$. The equivalences of the pairs of latches of latch mapping $R_L^{i-1}$ may be verified in a manner similar to the procedure used to validate the equivalence of the potentially equivalent nodes.

According to one embodiment, an optimization may be performed. As described previously, latches $L_{sub}$ comprising partial latch mapping $R_{L_{sub}}$ are condensed into a set of latch representatives $L_{rep} = \{l_{rep}^1, l_{rep}^2, \ldots, l_{rep}^q\}$ associated with latches $L - L_{sub}$. For a given iteration of i, and an arbitrary equivalence class C of current latch mapping $R_L^i$, the following optimization O-1 may be applied:

OPTIMIZATION O-1: If equivalence class $C \subseteq L_{rep}$, that is, all the latches of this class are representative latches, discard equivalence class C and remove from circuit model P the internal nodes that fan-out only to latches of equivalence class C.

That is, an equivalence class that includes only representative latches is split into equivalence classes that each include a representative latch. Typically, partial matches specified by latch mapping $R_{L_{sub}}$ are either complete to begin with, are to be matched with latches that are unmatched so far, or not important from the point of view of the latch mapping problem.

The method determines whether current latch mapping $R_L^i$ is equivalent or at least substantially similar to previous latch mapping $R_L^{i-1}$ at step 236. If latch mapping $R_L^i$ is not at least substantially similar to latch mapping $R_L^{i-1}$, the method returns to step 208, where a next circuit model is constructed. If latch mapping $R_L^i$ is at least substantially similar to latch mapping $R_L^{i-1}$, the method proceeds to step 240. Current latch mapping $R_L^i$ is reported as maximum equivalence relation $R_L^{max} = R_L^i$ at step 240. After reporting the maximum equivalence relation, the method terminates.

Modifications, additions, or omissions may be made to the method without departing from the scope of the invention. Additionally, steps may be performed in any suitable order without departing from the scope of the invention.

Certain embodiments of the invention may provide one or more technical advantages. A technical advantage of one embodiment may be that incomplete latch mapping techniques are combined with complete latch mapping techniques, which may allow for the efficiency of incomplete methods and the completeness of complete methods. Another technical advantage may be improved performance due to the use of incremental information to retain latch non-equivalencies and avoid re-verifying some latch equivalencies.

Although an embodiment of the invention and its advantages are described in detail, a person skilled in the art could make various alterations, additions, and omissions without departing from the spirit and scope of the present invention as defined by the appended claims.

What is claimed is:

1. A method for performing latch mapping, comprising:
   receiving an initial circuit model representing a first circuit and a second circuit;
   generating an initial latch mapping for the initial circuit model;

repeating the following until a next latch mapping is at least substantially similar to a current latch mapping to yield a final latch mapping:
constructing a current circuit model according to a previous circuit model;
establishing one or more current potentially equivalent node sets associated with the current circuit model in accordance with one or more previous potentially equivalent node sets, each potentially equivalent node set comprising one or more potentially equivalent nodes;
validating equivalence of the one or more current potentially equivalent node sets; and
verifying a current latch mapping in accordance with the validated one or more current potentially equivalent node sets to generate a next latch mapping; and
reporting the final latch mapping.

2. The method of claim 1, wherein validating equivalence of the one or more current potentially equivalent node sets comprises:
determining that a first potentially equivalent node is not equivalent to a second potentially equivalent node at a previous iteration; and
establishing that the first potentially equivalent node is not equivalent to the second potentially equivalent node at a current iteration.

3. The method of claim 1, wherein validating equivalence of the one or more current potentially equivalent node sets comprises:
determining that a first potentially equivalent node is equivalent to a second potentially equivalent node at a previous iteration, the first potentially equivalent node associated with one or more first fanin nodes, the second potentially equivalent node associated with one or more second fanin nodes;
determining that the one or more first fanin nodes remain unchanged from the previous iteration to a current iteration;
determining that the one or more second fanin nodes remain unchanged from the previous iteration to the current iteration; and
establishing that the first potentially equivalent node is equivalent to the second potentially equivalent node at the current iteration.

4. The method of claim 1, wherein validating equivalence of the one or more current potentially equivalent node sets comprises:
determining that a first potentially equivalent node is equivalent to a second potentially equivalent node at a previous iteration, the first potentially equivalent node associated with one or more first fanin nodes having one or more first constraints, the second potentially equivalent node associated with one or more second fanin nodes having one or more second constraints;
determining that there is no relative change between the first constraints and the second constraints; and
establishing that the first potentially equivalent node is equivalent to the second potentially equivalent node at a current iteration.

5. The method of claim 1, wherein establishing one or more current potentially equivalent node sets associated with the current circuit model in accordance with one or more previous potentially equivalent node sets comprises:
identifying one or more function changes associated with the one or more previous potentially equivalent node sets and the one or more current potentially equivalent node sets; and
recording the function changes.

6. The method of claim 1, wherein repeating the following until the next latch mapping is at least substantially similar to the current latch mapping to yield a final latch mapping comprises:
establishing one or more current latch equivalence sets corresponding to the current latch mapping;
identifying a current latch equivalence set that consists of one or more latch representatives; and
splitting the identified latch equivalence set into one or more next latch equivalence sets, each next latch equivalence set comprising a latch representative.

7. A system for performing latch mapping, comprising:
a database operable to store an initial circuit model representing a first circuit and a second circuit; and
a server system coupled to the database and operable to:
generate an initial latch mapping for the initial circuit model;
repeat the following until a next latch mapping is at least substantially similar to a current latch mapping to yield a final latch mapping:
construct a current circuit model according to a previous circuit model;
establish one or more current potentially equivalent node sets associated with the current circuit model in accordance with one or more previous potentially equivalent node sets, each potentially equivalent node set comprising one or more potentially equivalent nodes;
validate equivalence of the one or more current potentially equivalent node sets; and
verify a current latch mapping in accordance with the validated one or more current potentially equivalent node sets to generate a next latch mapping; and
report the final latch mapping.

8. The system of claim 7, wherein the server system is operable to validate equivalence of the one or more current potentially equivalent node sets by:
determining that a first potentially equivalent node is not equivalent to a second potentially equivalent node at a previous iteration; and
establishing that the first potentially equivalent node is not equivalent to the second potentially equivalent node at a current iteration.

9. The system of claim 7, wherein the server system is operable to validate equivalence of the one or more current potentially equivalent node sets by:
determining that a first potentially equivalent node is equivalent to a second potentially equivalent node at a previous iteration, the first potentially equivalent node associated with one or more first fanin nodes, the second potentially equivalent node associated with one or more second fanin nodes;
determining that the one or more first fanin nodes remain unchanged from the previous iteration to a current iteration;
determining that the one or more second fanin nodes remain unchanged from the previous iteration to the current iteration; and
establishing that the first potentially equivalent node is equivalent to the second potentially equivalent node at the current iteration.

10. The system of claim 7, wherein the server system is operable to validate equivalence of the one or more current potentially equivalent node sets by:
determining that a first potentially equivalent node is equivalent to a second potentially equivalent node at a previous iteration, the first potentially equivalent node associated with one or more first fanin nodes having one or more first constraints, the second potentially equivalent node associated with one or more second fanin nodes having one or more second constraints;

determining that there is no relative change between the first constraints and the second constraints; and establishing that the first potentially equivalent node is equivalent to the second potentially equivalent node at a current iteration.

11. The system of claim 7, wherein the server system is operable to establish one or more current potentially equivalent node sets associated with the current circuit model in accordance with one or more previous potentially equivalent node sets by:

identifying one or more function changes associated with the one or more previous potentially equivalent node sets and the one or more current potentially equivalent node sets; and recording the function changes.

12. The system of claim 7, wherein the server system is operable to repeat the following until the next latch mapping is at least substantially similar to the current latch mapping to yield a final latch mapping by:

establishing one or more current latch equivalence sets corresponding to the current latch mapping;

identifying a current latch equivalence set that consists of one or more latch representatives; and splitting the identified latch equivalence set into one or more next latch equivalence sets, each next latch equivalence set comprising a latch representative.

13. Logic for performing latch mapping, the logic embodied in a medium and operable to:

receive an initial circuit model representing a first circuit and a second circuit;

generate an initial latch mapping for the initial circuit model;

repeat the following until a next latch mapping is at least substantially similar to a current latch mapping to yield a final latch mapping:

construct a current circuit model according to a previous circuit model;

establish one or more current potentially equivalent node sets associated with the current circuit model in accordance with one or more previous potentially equivalent node sets, each potentially equivalent node set comprising one or more potentially equivalent nodes;

validate equivalence of the one or more current potentially equivalent node sets; and verify a current latch mapping in accordance with the validated one or more current potentially equivalent node sets to generate a next latch mapping; and report the final latch mapping.

14. The logic of claim 13, operable to validate equivalence of the one or more current potentially equivalent node sets by:

determining that a first potentially equivalent node is not equivalent to a second potentially equivalent node at a previous iteration; and establishing that the first potentially equivalent node is not equivalent to the second potentially equivalent node at a current iteration.

15. The logic of claim 13, operable to validate equivalence of the one or more current potentially equivalent node sets by:

determining that a first potentially equivalent node is equivalent to a second potentially equivalent node at a previous iteration, the first potentially equivalent node associated with one or more first fanin nodes, the second potentially equivalent node associated with one or more second fanin nodes;

determining that the one or more first fanin nodes remain unchanged from the previous iteration to a current iteration;

determining that the one or more second fanin nodes remain unchanged from the previous iteration to the current iteration; and establishing that the first potentially equivalent node is equivalent to the second potentially equivalent node at the current iteration.

16. The logic of claim 13, operable to validate equivalence of the one or more current potentially equivalent node sets by:

determining that a first potentially equivalent node is equivalent to a second potentially equivalent node at a previous iteration, the first potentially equivalent node associated with one or more first fanin nodes having one or more first constraints, the second potentially equivalent node associated with one or more second fanin nodes having one or more second constraints;

determining that there is no relative change between the first constraints and the second constraints; and establishing that the first potentially equivalent node is equivalent to the second potentially equivalent node at a current iteration.

17. The logic of claim 13, operable to establish one or more current potentially equivalent node sets associated with the current circuit model in accordance with one or more previous potentially equivalent node sets by:

identifying one or more function changes associated with the one or more previous potentially equivalent node sets and the one or more current potentially equivalent node sets; and recording the function changes.

18. The logic of claim 13, operable to repeat the following until the next latch mapping is at least substantially similar to the current latch mapping to yield a final latch mapping by:

establishing one or more current latch equivalence sets corresponding to the current latch mapping;

identifying a current latch equivalence set that consists of one or more latch representatives; and splitting the identified latch equivalence set into one or more next latch equivalence sets, each next latch equivalence set comprising a latch representative.

19. A system for performing latch mapping, comprising:

means for receiving an initial circuit model representing a first circuit and a second circuit;

means for generating an initial latch mapping for the initial circuit model;

means for repeating the following until a next latch mapping is at least substantially similar to a current latch mapping to yield a final latch mapping:

constructing a current circuit model according to a previous circuit model;

establishing one or more current potentially equivalent node sets associated with the current circuit model in accordance with one or more previous potentially equivalent node sets, each potentially equivalent node set comprising one or more potentially equivalent nodes;

validating equivalence of the one or more current potentially equivalent node sets; and verifying a current latch mapping in accordance with the validated one or more current potentially equivalent node sets to generate a next latch mapping; and means for reporting the final latch mapping.

20. A method for performing latch mapping, comprising:

receiving an initial circuit model representing a first circuit and a second circuit;

generating an initial latch mapping for the initial circuit model;
repeating the following until a next latch mapping is at least substantially similar to a current latch mapping to yield a final latch mapping:
constructing a current circuit model according to a previous circuit model;
establishing one or more current latch equivalence sets corresponding to the current latch mapping, identifying a current latch equivalence set that consists of one or more latch representatives, and splitting the identified latch equivalence set into one or more next latch equivalence sets, each next latch equivalence set comprising a latch representative;
establishing one or more current potentially equivalent node sets associated with the current circuit model in accordance with one or more previous potentially equivalent node sets, each potentially equivalent node set comprising one or more potentially equivalent nodes, by identifying one or more function changes associated with the one or more previous potentially equivalent node sets and the one or more current potentially equivalent node sets, and recording the function changes;
validating equivalence of the one or more current potentially equivalent node sets by:
determining that a first potentially equivalent node is not equivalent to a second potentially equivalent node at the previous iteration, and establishing that the first potentially equivalent node is not equivalent to the second potentially equivalent node at the current iteration;
determining that a third potentially equivalent node is equivalent to a fourth potentially equivalent node at a previous iteration, the third potentially equivalent node associated with one or more third fanin nodes, the fourth potentially equivalent node associated with one or more fourth fanin nodes, determining that the one or more third fanin nodes remain unchanged from the previous iteration to a current iteration, determining that the one or more fourth fanin nodes remain unchanged from the previous iteration to the current iteration, and establishing that the third potentially equivalent node is equivalent to the fourth potentially equivalent node at the current iteration; and
determining that a fifth potentially equivalent node is equivalent to a sixth potentially equivalent node at a previous iteration, the fifth potentially equivalent node associated with one or more fifth fanin nodes having one or more fifth constraints, the sixth potentially equivalent node associated with one or more sixth fanin nodes having one or more sixth constraints, determining that there is no relative change between the fifth constraints and the sixth constraints, and establishing that the fifth potentially equivalent node is equivalent to the sixth potentially equivalent node at a current iteration;
verifying a current latch mapping in accordance with the validated one or more current potentially equivalent node sets to generate a next latch mapping; and
reporting the final latch mapping.
21. A method for performing latch mapping, comprising:
accessing a circuit model representing a first circuit and a second circuit;
receiving a first partial latch mapping of the circuit model, the first partial latch mapping designating one or more current latch equivalence sets;
selecting a latch representative from each current latch equivalence set;
organizing one or more next latch equivalence sets according to the latch representatives;
generating a modified circuit model in accordance with the next latch representatives equivalence sets;
determining a second partial latch mapping of the modified circuit model according to a complete latch mapping technique; and
determining a latch mapping in accordance with the first partial latch mapping and the second partial latch mapping.
22. The method of claim 21, wherein accessing a first partial latch mapping comprises determining the first partial latch mapping according to an incomplete latch mapping technique.
23. The method of claim 21, wherein accessing a first partial latch mapping comprises retrieving the first partial latch mapping from a database.
24. The method of claim 21, wherein organizing the next latch equivalence sets according to the latch representatives comprises:
identifying the latch representative of each current latch equivalence set;
selecting one or more latches, the one or more latches not members of the current latch equivalence sets; and
organizing the latch representatives and the one or more latches to yield the next latch equivalence sets.
25. A system for performing latch mapping, comprising:
a database operable to store a circuit model representing a first circuit and a second circuit; and
a server system coupled to the database and operable to:
access the circuit model;
receive a first partial latch mapping of the circuit model, the first partial latch mapping designating one or more current latch equivalence sets;
select a latch representative from each current latch equivalence set;
organize one or more next latch equivalence sets according to the latch representatives;
generate a modified circuit model in accordance with the next latch representatives equivalence sets;
determine a second partial latch mapping of the modified circuit model according to a complete latch mapping technique; and
determine a latch mapping in accordance with the first partial latch mapping and the second partial latch mapping.
26. The system of claim 25, wherein the server system is operable to access a first partial latch mapping by determining the first partial latch mapping according to an incomplete latch mapping technique.
27. The system of claim 25, wherein the server system is operable to access a first partial latch mapping by retrieving the first partial latch mapping from the database.
28. The system of claim 25, wherein the server system is operable to organize the next latch equivalence sets according to the latch representatives by:
identifying the latch representative of each current latch equivalence set;
selecting one or more latches, the one or more latches not members of the current latch equivalence sets; and
organizing the latch representatives and the one or more latches to yield the next latch equivalence sets.
29. Logic for performing latch mapping, the logic embodied in a medium and operable to:
access a circuit model representing a first circuit and a second circuit;

receive a first partial latch mapping of the circuit model, the first partial latch mapping designating one or more current latch equivalence sets;

select a latch representative from each current latch equivalence set;

organize one or more next latch equivalence sets according to the latch representatives;

generate a modified circuit model in accordance with the next latch representatives equivalence sets;

determine a second partial latch mapping of the modified circuit model according to a complete latch mapping technique; and determine a latch mapping in accordance with the first partial latch mapping and the second partial latch mapping.

30. The logic of claim 29, operable to access a first partial latch mapping by determining the first partial latch mapping according to an incomplete latch mapping technique.

31. The logic of claim 29, operable to access a first partial latch mapping by retrieving the first partial latch mapping from a database.

32. The logic of claim 29, operable to organize the next latch equivalence sets according to the latch representatives by:

identifying the latch representative of each current latch equivalence set;

selecting one or more latches, the one or more latches not members of the current latch equivalence sets; and organizing the latch representatives and the one or more latches to yield the next latch equivalence sets.

33. A system for performing latch mapping, comprising:

means for accessing a circuit model representing a first circuit and a second circuit;

means for receiving a first partial latch mapping of the circuit model, the first partial latch mapping designating one or more current latch equivalence sets;

means for selecting a latch representative from each current latch equivalence set;

means for organizing one or more next latch equivalence sets according to the latch representatives;

means for generating a modified circuit model in accordance with the next latch representatives equivalence sets;

means for determining a second partial latch mapping of the modified circuit model according to a complete latch mapping technique; and means for determining a latch mapping in accordance with the first partial latch mapping and the second partial latch mapping.

34. A method for performing latch mapping, comprising:

accessing a circuit model representing a first circuit and a second circuit by determining the first partial latch mapping according to an incomplete latch mapping technique, and by retrieving the first partial latch mapping from a database;

receiving a first partial latch mapping of the circuit model, the first partial latch mapping designating one or more current latch equivalence sets;

selecting a latch representative from each current latch equivalence set;

organizing one or more next latch equivalence sets according to the latch representatives by identifying the latch representative of each current latch equivalence set, selecting one or more latches, the one or more latches not members of the current latch equivalence sets, and organizing the latch representatives and the one or more latches to yield the next latch equivalence sets;

generating a modified circuit model in accordance with the next latch representatives equivalence sets;

determining a second partial latch mapping of the modified circuit model according to a complete latch mapping technique; and determining a latch mapping in accordance with the first partial latch mapping and the second partial latch mapping.

* * * * *

UNITED STATES PATENT AND TRADEMARK OFFICE
CERTIFICATE OF CORRECTION

PATENT NO. : 7,032,192 B2
APPLICATION NO. : 10/444232
DATED : April 18, 2006
INVENTOR(S) : Mukul R. Prasad, et al.

It is certified that error appears in the above-identified patent and that said Letters Patent is hereby corrected as shown below:

Col. 5, L. 29: After "$\subseteq$" delete "$R_L$ max", insert, -- $R_L^{max}$ --;

Col. 5, L. 39: Before "may be" delete "$l_{rep}i$" insert, -- $l_{rep}^i$ --;

Col. 5, L. 41: Before "as well as" delete "$L_{sub} - \cup_{i=1}^q l_{rep}^i$" insert, -- $L_{sub} - \cup_{i=1}^q l_{rep}^i$ --;

Col. 5, L. 48: After "mapping" delete "$R_{rep}^{max}$" insert, -- $R_{rep}^{max}$ --;

Col. 5, L. 57: After "mapping" delete "$R_L^{i+1}$" insert, -- $R_L^{i+1}$ --;

Col. 5, L. 58: After "classes of" delete "$R_L^i$" insert, -- $R_L^i$ --;

Col. 5, L. 62: Before "which yields" delete "$R_L^{i+1} = R_L^i$" insert, -- $R_L^{i+1} = R_L^i$ --;

Col. 5, L. 63: After "relation" delete "$R_L^{max} = R_L^i$" insert, -- $R_L^{max} = R_L^i$ --;

Col. 5, L. 64: Before "is determined" delete "$\langle R_{L\,sub} \vee R_{rep}^{max} \rangle$"

insert, -- $\langle R_{L_{sub}} \vee R_{rep}^{max} \rangle = R_L^{max}$ --;

Col. 5, L. 66: Before "may" delete "$R_{rep}^{max}$" insert, -- $R_{rep}^{max}$ --;

Col. 5, L. 66: After "partial latch mapping" delete "$R_{rep}^{max}$" insert, -- $R_{rep}^{max}$ --;

Col. 5, L. 67: After "correspondence" delete "$R_L^{max}$" insert, -- $R_L^{max}$ --;

Col. 6, L. 6: After "mapping" delete "$R_{rep}^{max}$" insert, -- $R_{rep}^{max}$ --;

Col. 6, L. 8: After "$\langle R_{L\,sub} \vee R_{rep}^{max} \rangle = R_L^{max}$" delete "$\langle R_{L\,sub} \vee R_{rep}^{max} \rangle = R_L^{max}$"

insert, -- $\langle R_{L_{sub}} \vee R_{rep}^{max} \rangle = R_L^{max}$ --;

Col. 6, L. 32: After "latch mapping" delete "$R_L^0$" insert, -- $R_L^0$ --;

Col. 6, L. 33: After "according to" delete "$R_L^0$" insert, -- $R_L^0$ --;

UNITED STATES PATENT AND TRADEMARK OFFICE
CERTIFICATE OF CORRECTION

PATENT NO. : 7,032,192 B2
APPLICATION NO. : 10/444232
DATED : April 18, 2006
INVENTOR(S) : Mukul R. Prasad, et al.

It is certified that error appears in the above-identified patent and that said Letters Patent is hereby corrected as shown below:

Col. 6, L. 38: After "latch mapping" delete "$R_L{}^{i-1}$" insert, -- $R_L^{i-1}$ --;

Col. 6, L. 43: After "latch mapping" delete "$R_L{}^{i-1}$" insert, -- $R_L^{i-1}$ --;

Col. 6, L. 45: After "latch" delete "$l_{rep}{}^j$" insert, -- $l_{rep}^j$ --;

Col. 6, L. 47: After "latch" delete "$l_{rep}{}^j$" insert, -- $l_{rep}^j$ --;

Col. 6, L. 49: After "latch mapping" delete "$R_L{}^{i-1}$" insert, -- $R_L^{i-1}$ --;

Col. 6, L. 55: After "sets" delete "$Q_{init}{}^1$" insert, -- $Q_{init}^1$ --;

Col. 6, L. 59: After "sets" delete "$Q_{init}{}^i$" insert, -- $Q_{init}^i$ --;

Col. 6, L. 60: After "sets" delete "$Q_{final}{}^{i-1}$" insert, -- $Q_{final}^{i-1}$ --;

Col. 6, L. 60: After "according to" delete "$Q_{init}{}^i = Q_{final}{}^{i-1}$" insert, -- $Q_{init}^i = Q_{final}^{i-1}$ --;

Col. 7, L. 30: After "mapping" delete "$R_L{}^i$" insert, -- $R_L^i$ --;

Col. 7, L. 37: After "mapping" delete "$R_L{}^{i-1}$ to $R_L{}^i$" insert, -- $R_L^{i-1}$ to $R_L^i$ --;

Col. 7, L. 40: After "nodes" delete "$w_{1 \text{ and } w2}$" insert, -- $w_1$ and $w_2$ --;

Col. 7, L. 41: After "nodes" delete " $w_1{}^i \neq w_2{}^i \Rightarrow w_1{}^j \neq w_2{}^j$ " insert, -- $w_1^i \neq w_2^i \Rightarrow w_1^j \neq w_2^j$ --;

Col. 7, L. 46: delete "$w_1{}^i = w_2{}^i$", insert -- $w_1^i = w_2^i$ --;

Col. 7, L. 48: After " $\forall l_1, l_2 \in (L \cap TFI(w_1)) R_L{}^{i+1}(l_1, l_2) \Leftrightarrow R_L{}^i(l_1, l_2)$ " insert, -- $\forall l_1, l_2 \in (L \cap TFI(w_1)) R_L^{i+1}(l_1, l_2) \Leftrightarrow R_L^i(l_1, l_2)$ --;

Col. 7, L. 50: After " $\forall l_1, l_2 \in (L \cap TFI(w_2)) R_L{}^{i+1}(l_1, l_2) \Leftrightarrow R_L{}^i(l_1, l_2)$ " insert, -- $\forall l_1, l_2 \in (L \cap TFI(w_2)) R_L^{i+1}(l_1, l_2) \Leftrightarrow R_L^i(l_1, l_2)$ --;

UNITED STATES PATENT AND TRADEMARK OFFICE
CERTIFICATE OF CORRECTION

PATENT NO. : 7,032,192 B2
APPLICATION NO. : 10/444232
DATED : April 18, 2006
INVENTOR(S) : Mukul R. Prasad, et al.

It is certified that error appears in the above-identified patent and that said Letters Patent is hereby corrected as shown below:

Col. 7, L. 51: After "then" delete "$w_1{}^{i+1} = w_2{}^{i+1}$" insert, -- $w_1^{i+1} = w_2^{i+1}$ --;

Col. 7, L. 58: After "if nodes" delete "$w_1{}^{i-1} = w_2{}^{i-1}$" insert, -- $w_1^{i-1} = w_2^{i-1}$ --;

Col. 7, L. 59: After "$affected(w_1{}') = NULL \wedge changed(w_2{}') = 0$" insert, -- $affected(w_1^i) = NULL \wedge changed(w_2^i) = 0$ --;

Col. 7, L. 60: After "affected" delete "$(w_1{}^i)$" insert, -- $(w_1^i)$ --;

Col. 7, L. 60: After "changed" delete "$(w_2{}^i)$" insert, -- $(w_2^i)$ --;

Col. 7, L. 62: After "affected" delete "$(w_2{}^i)$" insert, -- $(w_2^i)$ --;

Col. 7, L. 62: After "changed" delete "$(w_1{}^i)$" insert, -- $(w_1^i)$ --;

Col. 7, L. 64: After "changed" delete "$(w_1{}^i)$" insert, -- $(w_1^i)$ --;

Col. 7, L. 64: After "changed" delete "$(w_2{}^i)$" insert, -- $(w_2^i)$ --;

Col. 7, L. 65: After "affected" delete "$(w_1{}^i)$" insert, -- $(w_1^i)$ --;

Col. 7, L. 65: After "affected" delete "$(w_2{}^i)$" insert, -- $(w_2^i)$ --;

Col. 7, L. 66: After "then nodes" delete "$w_1{}^i = w_2{}^i$" insert, -- $w_1^i = w_2^i$ --;

Col. 8, L. 6: After "$Q^i$ and" delete "$R_L{}^{i-1}$" insert, -- $R_L^{i-1}$ --;

Col. 8, L. 7: Delete "$Q_{final}{}^i$" insert, -- $Q_{final}^i$ --;

Col. 8, L. 8: After "mapping" delete "$R_L{}^{i-1}$" and insert, -- $R_L^{i-1}$ --;

Col. 8, L. 9: After "mapping" delete "$R_L{}^i$" insert, -- $R_L^i$ --;

Col. 8, L. 10: After "mapping" delete "$R_L{}^{i-1}$" and insert, -- $R_L^{i-1}$ --;

Col 8, L. 16: After "mapping" delete "$L_{rep} = \{l_{rep}{}^1, l_{rep}{}^2, ... l_{rep}{}^q\}$" insert, -- $L_{rep} = \{l_{rep}^1, l_{rep}^2, ... l_{rep}^q\}$ --;

UNITED STATES PATENT AND TRADEMARK OFFICE
CERTIFICATE OF CORRECTION

PATENT NO. : 7,032,192 B2
APPLICATION NO. : 10/444232
DATED : April 18, 2006
INVENTOR(S) : Mukul R. Prasad, et al.

It is certified that error appears in the above-identified patent and that said Letters Patent is hereby corrected as shown below:

Col. 8, L. 24: Before "the following" delete "$R_L{}^i$" insert, -- $R_L^i$ --;

Col. 8, L. 33: Before "is equivalent" delete "$R_L{}^i$" insert -- $R_L^i$ --;

Col. 8, L. 34: After "mapping" delete "$R_L{}^{i-1}$" insert, -- $R_L^{i-1}$ --;

Col. 8, L. 34: Before "is not at least" delete "$R_L{}^i$" insert, -- $R_L^i$ --;

Col. 8, L. 35: Before "the method" delete "$R_L{}^{i-1}$" insert, -- $R_L^{i-1}$ --;

Col. 8, L. 37: After "If latch mapping" delete "$R_L{}^i$" insert, -- $R_L^i$ --;

Col. 8, L. 38: After "to latch mapping" delete "$R_L{}^{i-1}$" insert, -- $R_L^{i-1}$ --;

Col. 8, L. 39: After "mapping" delete "$R_L{}^i$" insert, -- $R_L^i$ --;

Col. 8, L. 40: After "relation" delete "$R_L{}^{max} = R_L{}^i$" insert, -- $R_L^{max} = R_L^i$ --.

Signed and Sealed this

Sixth Day of October, 2009

David J. Kappos
*Director of the United States Patent and Trademark Office*